United States Patent
Chang

(10) Patent No.: US 10,693,461 B1
(45) Date of Patent: Jun. 23, 2020

(54) POWER SWITCH CIRCUIT CAPABLE OF REDUCING LEAKAGE CURRENT

(71) Applicant: eMemory Technology Inc., Hsin-Chu (TW)

(72) Inventor: Chia-Fu Chang, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 16/807,169

(22) Filed: Mar. 3, 2020

Related U.S. Application Data

(60) Provisional application No. 62/832,853, filed on Apr. 11, 2019.

(51) Int. Cl.
| | |
|---|---|
| H03K 19/00 | (2006.01) |
| H03K 17/16 | (2006.01) |
| H03K 19/0185 | (2006.01) |
| H03K 3/356 | (2006.01) |
| H03K 19/0944 | (2006.01) |
| G05F 3/26 | (2006.01) |
| H02M 3/07 | (2006.01) |

(52) U.S. Cl.
CPC ......... *H03K 19/0013* (2013.01); *G05F 3/262* (2013.01); *H02M 3/07* (2013.01); *H03K 3/356* (2013.01); *H03K 17/162* (2013.01); *H03K 19/018528* (2013.01); *H03K 19/0944* (2013.01)

(58) Field of Classification Search
CPC ....... H03K 19/0013; H03K 19/018528; H03K 19/0944; G05F 3/262; H02M 3/07
See application file for complete search history.

(56) References Cited

U.S. PATENT DOCUMENTS

| | | | |
|---|---|---|---|
| 7,288,964 B2 | 10/2007 | Ku | |
| 7,423,472 B2* | 9/2008 | Hirose | H03K 17/162 327/407 |
| 7,746,154 B2* | 6/2010 | Merandat | H03K 17/005 327/407 |
| 9,225,175 B2* | 12/2015 | Kim | H01L 27/088 |
| 10,103,626 B1* | 10/2018 | Narayanan | H03K 17/687 |
| 2010/0013547 A1* | 1/2010 | Oka | H03K 19/0016 327/530 |
| 2011/0018614 A1* | 1/2011 | Kushima | H03K 19/0944 327/534 |

(Continued)

FOREIGN PATENT DOCUMENTS

TW I627833 6/2018

*Primary Examiner* — Seokjin Kim
(74) *Attorney, Agent, or Firm* — Winston Hsu

(57) ABSTRACT

A power switch circuit includes a voltage selection unit, a first level shift circuit, a second level shift circuit, a first transistor, a second transistor, and a leakage control unit. The voltage selection unit outputs a greater one of a first variable voltage and a system voltage as an operation voltage. The first level shift circuit outputs a first control signal by shifting a voltage of a first input signal. The second level shift circuit outputs a second control signal by shifting a voltage of a second input signal. The first transistor outputs the first variable voltage according to the first control signal. The second transistor outputs the system voltage according to the second control signal. The leakage control unit establishes an electrical connection between first terminal of the first transistor and the control terminal of the second transistor according to the operation voltage.

20 Claims, 5 Drawing Sheets

(56) References Cited

U.S. PATENT DOCUMENTS

| | | | |
|---|---|---|---|
| 2014/0340122 A1* | 11/2014 | Savanth | H02M 3/157 327/50 |
| 2015/0171858 A1* | 6/2015 | Matsuoka | H03K 3/35613 327/109 |
| 2017/0077920 A1* | 3/2017 | Huang | G11C 7/06 |
| 2019/0097622 A1* | 3/2019 | Raszka | H03K 17/162 |
| 2020/0118602 A1* | 4/2020 | Yang | G11C 11/417 |

* cited by examiner

US 10,693,461 B1

POWER SWITCH CIRCUIT CAPABLE OF REDUCING LEAKAGE CURRENT

CROSS REFERENCE TO RELATED APPLICATIONS

This non-provisional application claims priority of U.S. provisional application No. 62/832,853, filed on Apr. 11, 2019, included herein by reference in its entirety.

BACKGROUND OF THE INVENTION

1. Field of the Invention

The present invention is related to a power switch circuit, and more particularly, to a power switch circuit capable of reducing leakage current.

2. Description of the Prior Art

As the functions of electronic circuits become more and more complicated, the electronic circuits may require different levels of voltages for performing different operations. For example, the non-volatile memory circuit may use the system voltage for reading operation, and will use a higher voltage for programming operation. In this case, a power switch circuit will be applied to provide the required voltages on demand.

In the prior art, the power switch circuit is designed to output the highest input voltages. However, the high voltage used for program operation is usually generated by a charge pump, and the charge pump needs some time to pump the voltage to the target level. Therefore, if the input voltages received by the power switch circuit are at similar levels during the voltage pumping process of the charge pump, the power switch circuit would be stocked in an unstable status, producing a significant amount of leakage current.

SUMMARY OF THE INVENTION

One embodiment of the present invention discloses a power switch circuit. The power switch circuit includes an output terminal, a voltage selection unit, a first level shift circuit, a second level shift circuit, and a leakage control unit.

The output terminal outputs an output voltage. The voltage selection unit receives a first variable voltage and a second variable voltage, and outputs a greater one of the first variable voltage and the second variable voltage as an operation voltage. The first level shift circuit is coupled to the voltage selection unit, and outputs a first control signal according to a first input signal. The second level shift circuit is coupled to the voltage selection unit, and outputs a second control signal according to a second input signal.

The first transistor has a first terminal for receiving the first variable voltage, a second terminal coupled to the output terminal of the power switch circuit, and a control terminal coupled to the first level shift circuit for receiving the first control signal. The second transistor has a first terminal for receiving the second variable voltage, a second terminal coupled to the output terminal of the power switch circuit, and a control terminal coupled to the second level shift circuit for receiving the second control signal.

The leakage control unit has a first terminal coupled to the first terminal of the first transistor and/or the first terminal of the second transistor, a second terminal coupled to the control terminal of the second transistor, and a control terminal for receiving the operation voltage. The leakage control unit establishes an electrical connection between the first terminal and the second terminal of the leakage control unit according to the operation voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
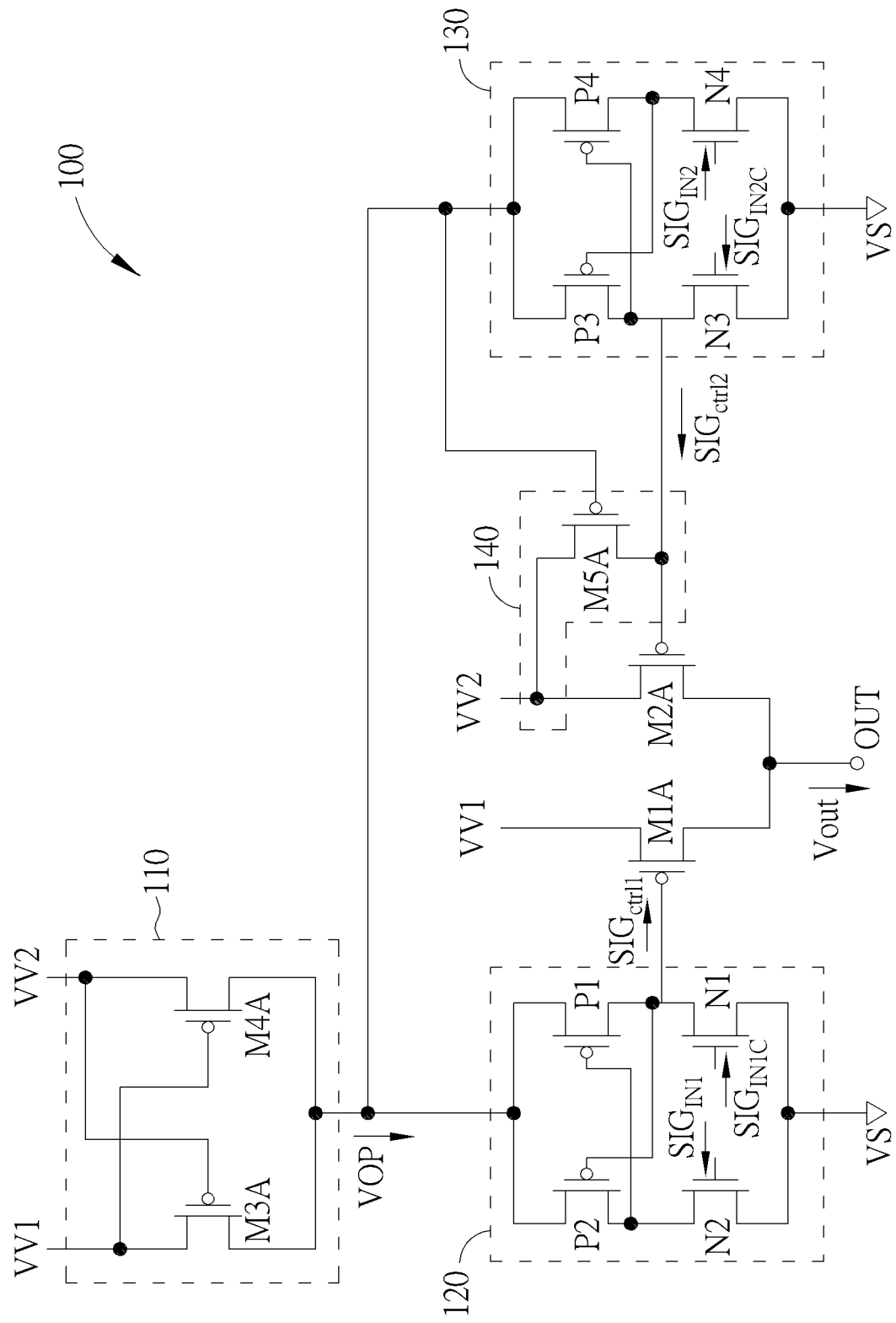
FIG. 1 shows a power switch circuit according to one embodiment of the present invention.

FIG. 1 shows a power switch circuit 100 according to one embodiment of the present invention. The power switch circuit 100 includes an output terminal OUT, a voltage selection unit 110, a first level shift circuit 120, a second level shift circuit 130, a first transistor M1A, a second transistor M2A, and a first leakage control unit 140.

The voltage selection unit 110 can receive a first variable voltage VV1 and a second variable voltage VV2, and output a greater one of the first variable voltage VV1 and the second variable voltage VV2 as an operation voltage VOP.

In FIG. 1, the voltage selection unit 110 can include an output terminal, a third transistor M3A, and a fourth transistor M4A. The output terminal of the voltage selection unit 110 can output the operation voltage VOP. The third transistor M3A has a first terminal for receiving the first variable voltage VV1, a second terminal coupled to the output terminal of the voltage selection unit 110, and a control terminal for receiving the second variable voltage VV2. The fourth transistor M4A has a first terminal for receiving the second variable voltage VV2, a second terminal coupled to the output terminal of the voltage selection unit 110, and a control terminal for receiving the first variable voltage VV1.

Also, in FIG. 1, the third transistor M3A and the fourth transistor M4A can be P-type transistors. In this case, when the first variable voltage VV1 is greater than the second variable voltage VV2, the third transistor M3A will be turned on and the fourth transistor M4A will be turned off. Therefore, the voltage selection unit 110 will output the first variable voltage VV1 as the operation voltage VOP through the output terminal of the voltage selection unit 110. However, if the second variable voltage VV2 is greater than the first variable voltage VV1, then the third transistor M3A will be turned off and the fourth transistor M4A will be turned on. In this case, the voltage selection unit 110 will output the second variable voltage VV2 as the operation voltage VOP.

The first level shift circuit 120 is coupled to the voltage selection unit 110, and can output a first control signal $SIG_{ctrl1}$ according to the first input signal $SIG_{IN1}$. Similarly, the second level shift circuit 130 is coupled to the voltage selection unit 110, and can output a second control signal $SIG_{ctrl2}$ according to a second input signal $SIG_{IN2}$.

In FIG. 1, the first level shift circuit 120 and the second level shift circuit 130 can have the same structures. For example, the first level shift circuit 120 includes P-type transistors P1 and P2, and N-type transistors N1 and N2. The P-type transistor P1 has a first terminal coupled to the voltage selection unit 110 for receiving the operation voltage VOP, a second terminal for outputting the first control signal $SIG_{ctrl1}$, and a control terminal. The P-type transistor P2 has a first terminal coupled to the voltage selection unit 110 for receiving the operation voltage VOP, a second terminal coupled to the control terminal of the P-type transistor P1, and a control terminal coupled to the second terminal of the P-type transistor P1. The N-type transistor N1 has a first terminal coupled to the second terminal of the P-type transistor P1, a second terminal for receiving a system voltage VS, and a control terminal for receiving a first complementary input signal $SIG_{IN1C}$ complementary with the first input signal $SIG_{IN1}$. The N-type transistor N2 has a first terminal coupled to the second terminal of the P-type transistor P2, a second terminal for receiving the system voltage VS, and a control terminal for receiving the first input signal $SIG_{IN1}$.

Similarly, the second level shift circuit 130 can include P-type transistors P3 and P4, and N-type transistors N3 and N4. In this case, the control terminal of the N-type transistor N4 can receive the second input signal $SIG_{IN2}$, and the control terminal of the N-type transistor N3 can receive a second complementary input signal $SIG_{IN2C}$ complementary with the second input signal $SIG_{IN2}$. Also, the second terminal of the P-type transistor P3 will output the second control signal $SIG_{ctrl2}$. However, in some other embodiments, the first level shift circuit 120 and the second level shift circuit 130 may also be implemented by some different structures.

In FIG. 1, the first transistor M1A has a first terminal for receiving the first variable voltage VV1, a second terminal coupled to the output terminal OUT of the power switch circuit 100, and a control terminal coupled to the first level shift circuit 120 for receiving the first control signal $SIG_{ctrl1}$. The second transistor M2A has a first terminal for receiving the second variable voltage VV2, a second terminal coupled to the output terminal OUT of the power switch circuit 100, and a control terminal coupled to the second level shift circuit 130 for receiving the second control signal $SIG_{ctrl2}$. In FIG. 1, the first transistor M1A and the second transistor M2A can be P-type transistors.

Also, in some embodiments, the input signals $SIG_{IN1}$ and $SIG_{IN2}$ can be complementary so that only one of the first transistor M1A and the second transistor M2A will be turned on at a time for outputting the second variable voltage VV2 or the first variable voltage VV1 as required. For example, when the power switch circuit 100 is used to output the second variable voltage VV2, the first input signal $SIG_{IN1}$ would be at the second variable voltage VV2 and the second input signal $SIG_{IN2}$ would be at a system voltage VS smaller than the second variable voltage VV2. In this case, the first control signal $SIG_{ctrl1}$ would be raised to the operation voltage VOP by the first level shift circuit 120 while the second control signal $SIG_{ctrl2}$ may remain at the system voltage VS. Consequently, the first transistor M1A will be turned off, the second transistor M2A will be turned on, and the power switch circuit 100 will output the second variable voltage VV2 as the output voltage Vout through the output terminal OUT.

In some embodiments, the power switch circuit 100 can output the first variable voltage VV1 and the second variable voltage VV2 as the output voltage Vout for performing the read operation and the program operation of a memory cell. However, in some other embodiments, the power switch circuit 100 may be adopted in other application for providing the operation voltage VOP required.

Furthermore, in some embodiments, the first variable voltage VV1 can be generated by a charge pump, and the second variable voltage VV2 can be an existing system voltage. In this case, when the charge pump is disabled, the first variable voltage VV1 may be smaller than the second variable voltage VV2. However, after the charge pump is enabled, the first variable voltage VV1 may be increased from being smaller than the second variable voltage VV2 to being greater than the second variable voltage VV2.

Therefore, before the first variable voltage VV1 reaches the targeted level, the first variable voltage VV1 may become substantially equal to the second variable voltage VV2 for a period of time. In this case, the operation voltage VOP generated by the voltage selection unit 110 would be smaller than second variable voltage VV2 by a threshold voltage of the fourth transistor M4A. Consequently, when the power switch circuit 100 is used to output the first variable voltage VV1, the first input signal $SIG_{IN1}$ would be at the system voltage VS and the second input signal $SIG_{IN2}$ would be at a second variable voltage VV2. Correspondingly, the first control signal $SIG_{ctrl1}$ remains at the system voltage VS while the second control signal $SIG_{ctrl2}$ would be raised to the operation voltage VOP. However, since the operation voltage VOP is equal to the second variable voltage VV2 minus the threshold voltage of the fourth transistor M4A, the operation voltage VOP would be smaller than the first variable voltage VV1. Therefore, the second transistor M2A may not be turned off as expected, and the first transistor M1A and the second transistor M2A may be turned on at the same time, causing a significant leakage current flowing from the first terminal of the first transistor M1A through the first transistor M1A and the second transistor M2A to the first terminal of the second transistor M2A. Furthermore, the leakage current may be a huge burden to the charge pump, and the charge pump may not be able to further increase the first variable voltage VV1. Consequently, the first variable voltage VV1 will never reach its target value, resulting in operation fail.

In some embodiments, the first leakage control unit 140 can be used to reduce the leakage current aforementioned. In FIG. 1, the first leakage control unit 140 has a first terminal coupled to the first terminal of the second transistor M2A, a second terminal coupled to the control terminal of the second transistor M2A, and a control terminal for receiving the operation voltage VOP. The first leakage control unit 140 can establish an electrical connection between the first terminal and the second terminal of the first leakage control unit 140 according to the operation voltage VOP.

For example, the first leakage control unit 140 can establish the electrical connection when the first variable voltage VV1 is substantially equal to the second variable voltage VV2. Therefore, in the case that the power switch circuit 100 needs to output the first variable voltage VV1 while the operation voltage VOP is lower than the second variable voltage VV2, the first leakage control unit 140 can raise the voltage of the control terminal of the second transistor M2A to the second variable voltage VV2 so that the second transistor M2A can be turned off, reducing the leakage current.

In FIG. 1, the first leakage control unit 140 includes a fifth transistor M5A. The fifth transistor M5A has a first terminal coupled to the first terminal of the first leakage control unit 140, a second terminal coupled to the second terminal of the first leakage control unit 140, and a control terminal coupled to the control terminal of the first leakage control unit 140. Also, the fifth transistor M5A can be a P-type transistor.

In this case, when the second control signal $SIG_{ctrl2}$ is raised to the operation voltage VOP while the operation voltage VOP is lower than the second variable voltage VV2, the fifth transistor M5A will be turned on. Consequently, the voltage of the control terminal of the second transistor M2A can be raised to the second variable voltage VV2 through the fifth transistor M5A so the second transistor M2A can be turned off as required.

Since the fifth transistor M5A is used to raise the voltage of the control terminal of the second transistor M2A without requiring a large current, the size of the fifth transistor M5A can be smaller than the size of the first transistor M1A, and the size of the fifth transistor M5A can be smaller than the size of the second transistor M2A. Consequently, the leakage current caused during the pumping process of the first variable voltage VV1 can be reduced with only small additional circuit area.

Figure 2:
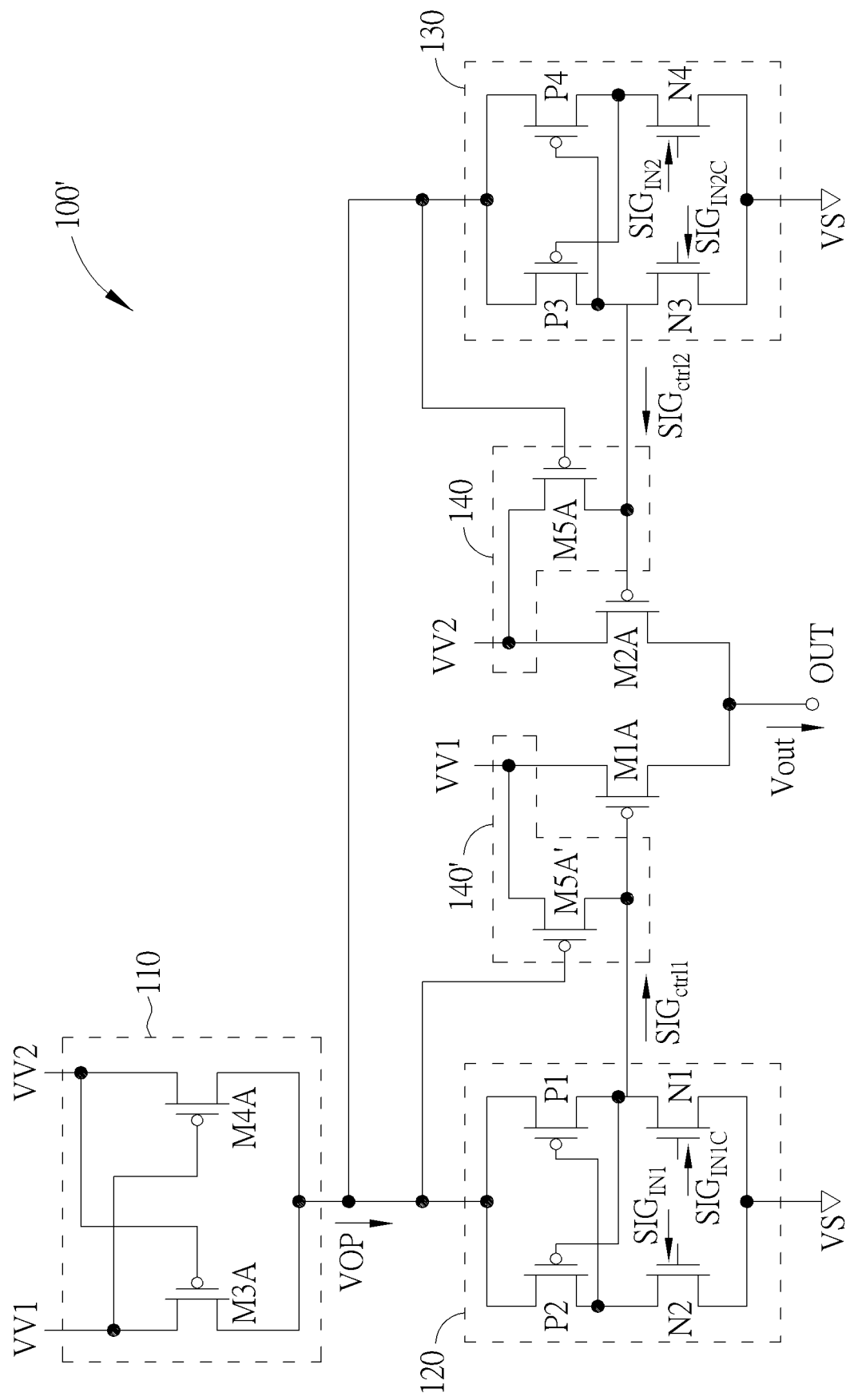
FIG. 2 shows a power switch circuit according to another embodiment of the present invention.

FIG. 2 shows a power switch circuit 100' according to another embodiment of the present invention. The power switch circuit 100' and the power switch circuit 100 have similar structures and can be operated with the same principles. However, the power switch circuit 100' further includes a second leakage control unit 140'. The second leakage control unit 140' has a first terminal coupled to the first terminal of the first transistor M1A, a second terminal coupled to the control terminal of the first transistor M1A, and a control terminal for receiving the operation voltage VOP. The second leakage control unit 140' can establish an electrical connection between the first terminal and the second terminal of the second leakage control unit 140' according to the operation voltage VOP.

The second leakage control unit 140' can have the same structure as the first leakage control unit 140, and can perform the same function to reduce the leakage current. For example, the second leakage control unit 140' can include a transistor M5A'. The transistor M5A' has a first terminal coupled to the first terminal of the second leakage control unit 140', a second terminal coupled to the control terminal of the second leakage control unit 140', and a control terminal coupled to the control terminal of the second leakage control unit 140'. Also, the transistor M5A' can be a P-type transistor. In this case, when the control signal $SIG_{ctrl1}$ is meant to turn off the first transistor M1A but is not high enough to fully turn off the first transistor M1A, the second leakage control unit 140' can be turned on to raise the voltage of the control terminal of the first transistor M1A. Consequently, the first transistor M1A can be turned off and the leakage current can be reduced.

Figure 3:
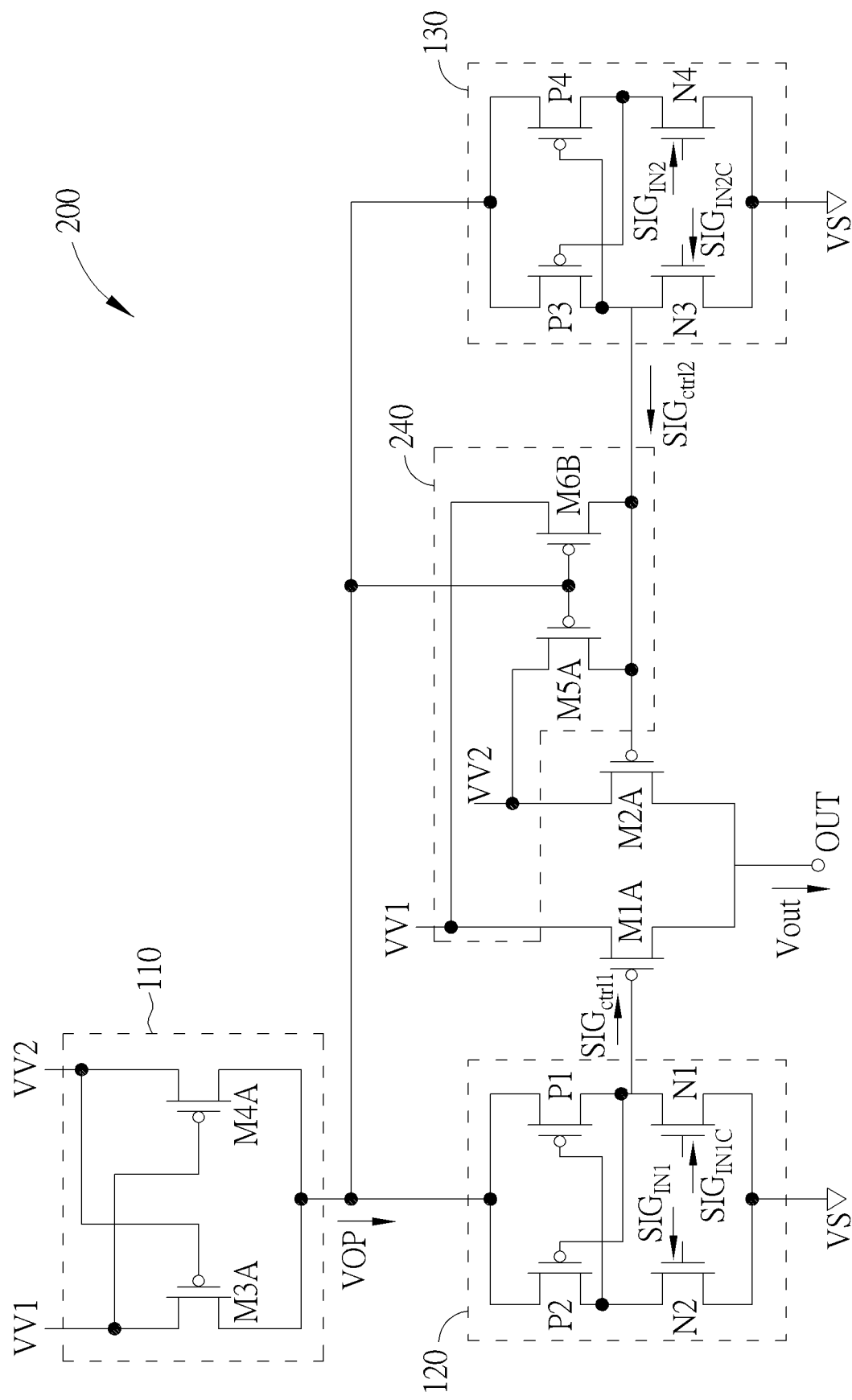
FIG. 3 shows a power switch circuit according to another embodiment of the present invention.

FIG. 3 shows a power switch circuit 200 according to another embodiment of the present invention. The power switch circuit 200 and the power switch circuit 100 have similar structures and can be operated with similar principles. However, the first leakage control unit 240 further includes a sixth transistor M6B. The sixth transistor M6B has a first terminal coupled to the first terminal of the first transistor M1A, a second terminal coupled to the second terminal of the first leakage control unit 240, and a control terminal coupled to the control terminal of the first leakage control unit 240. The sixth transistor M6B can be P-type transistor.

In this case, when the second control signal $SIG_{ctrl2}$ is raised to the operation voltage VOP while the operation voltage VOP is lower than the second variable voltage VV2, the fifth transistor M5A and the sixth transistor M6B will both be turned on. Consequently, the voltage of the control terminal of the second transistor M2A can be raised to the second variable voltage VV2 through the fifth transistor M5A and the sixth transistor M6B so the second transistor M2A can be turned off as required.

Since the sixth transistor M6B is used to raise the voltage of the control terminal of the second transistor M2A without requiring large current, the sixth transistor M6B can also be smaller than the first transistor M1A and the second transistor M2A.

In some embodiments, if the sixth transistor M6B can reduce the leakage current effectively, the fifth transistor M5A may be omitted.

Also, in some embodiments, the sixth transistor M6B may cause leakage current when the power switch circuit 200 is used to output the second variable voltage VV2 as the output voltage Vout. For example, when the first input signal $SIG_{IN1}$ is at the second variable voltage VV2 and the second input signal $SIG_{IN2}$ is at the system voltage VS, the first control signal $SIG_{ctrl1}$ would be raised to the operation voltage VOP and second control signal $SIG_{ctrl2}$ would be at the system voltage VS. Therefore, the first transistor M1A should be turned off and the second transistor M2A should be turned on for outputting the second variable voltage VV2 as the output voltage Vout.

However, in this case, if the first variable voltage VV1 is substantially equal to the second variable voltage VV2, the operation voltage VOP would be lower than the first variable voltage VV1 by the threshold voltage of the fourth transistor M4A, and the sixth transistor M6B will be turned on. Consequently, the leakage current may flow from the first terminal of the sixth transistor M6B through the N-type transistor N3 in the second level shift circuit 130 to the ground. The leakage current can be a huge burden to the charge pump, and the charge pump may not be able to further increase the first variable voltage VV1. To reduce the leakage current, another transistor may be added.

Also, in some embodiments, the power switch circuit 200 can further include a second leakage control unit having the same structure as the first leakage control unit 240. The second leakage control unit can be coupled to the first terminal and the control terminal of the first transistor M1A and can be controlled by the operation voltage VOP. Therefore, when the control signal $SIG_{ctrl1}$ is meant to turn off the first transistor M1A but is not high enough to fully turn off the first transistor M1A, the second leakage control unit can be turned on to raise the voltage of the control terminal of the first transistor M1A. Consequently, the first transistor M1A can be turned off and the leakage current can be reduced.

Figure 4:
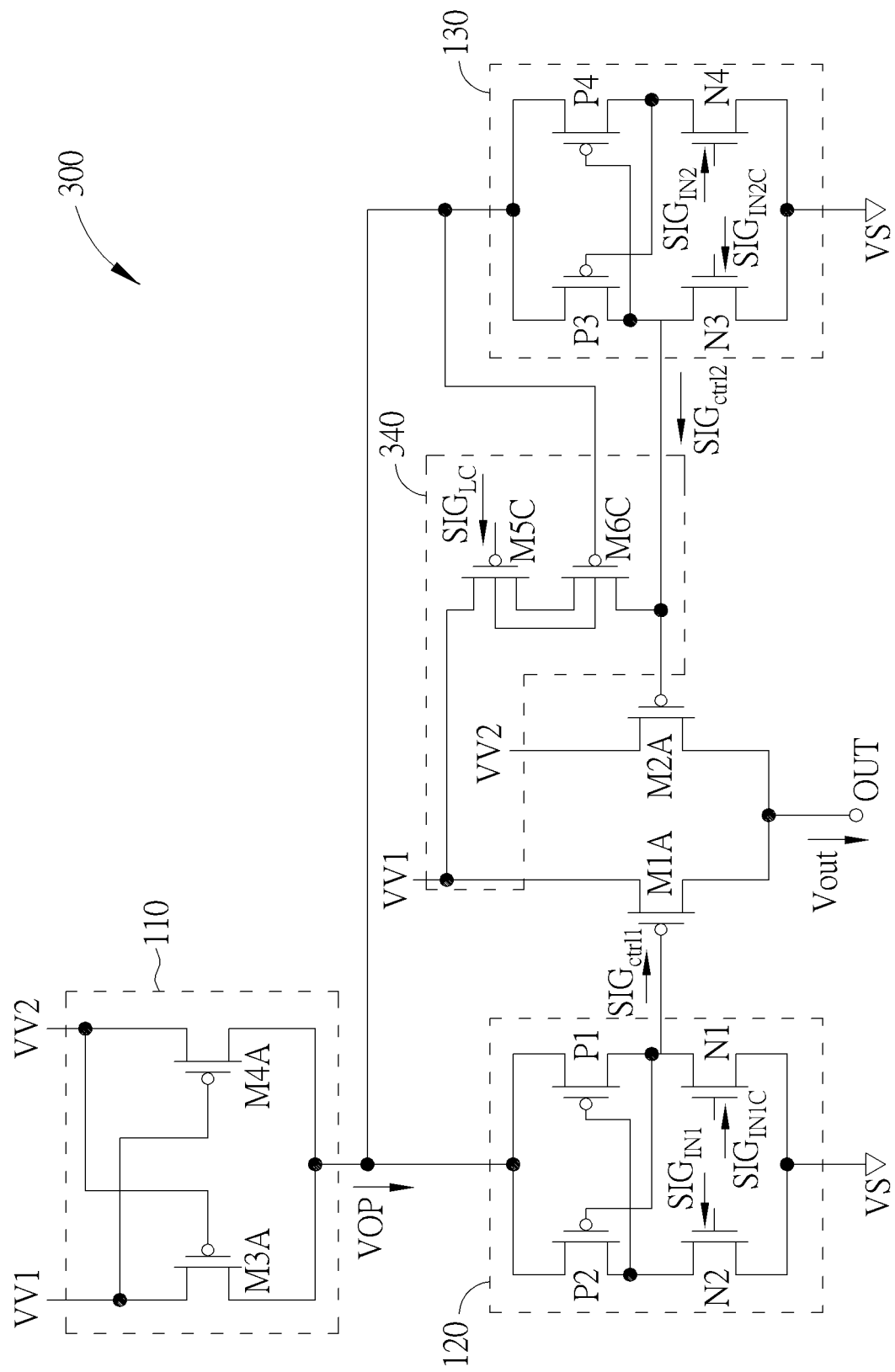
FIG. 4 shows a power switch circuit according to another embodiment of the present invention.

FIG. 4 shows a power switch circuit 300 according to another embodiment of the present invention. The power switch circuit 300 and the power switch circuit 100 have similar structures and can be operated with similar principles. However, the first leakage control unit 340 includes a fifth transistor M5C and a sixth transistor M6C.

The fifth transistor M5C has a first terminal coupled to the first terminal of the first transistor M1A, a second terminal, and a control terminal for receiving a leakage control signal $SIG_{LC}$. The sixth transistor M6C has a first terminal coupled to the second terminal of the fifth transistor M5C, a second terminal coupled to the second terminal of the first leakage control unit 340, and a control terminal coupled to the control terminal of the first leakage control unit 340. Also, the fifth transistor M5C and the sixth transistor M6C can be P-type transistors, and the body terminal of the fifth transistor M5C can be coupled to the body terminal of the sixth transistor M6C.

In some embodiments, the leakage control signal $SIG_{LC}$ can be generated according to the first input signal $SIG_{IN1}$. For example, the leakage control signal $SIG_{LC}$ can be substantially equal to the first input signal $SIG_{IN1}$. In this case, when the first input signal $SIG_{IN1}$ is at the second variable voltage VV2 and the second input signal $SIG_{IN2}$ is at the system voltage VS, the fifth transistor M5C will be turned off. Consequently, the leakage current caused by the sixth transistor M6B when the power switch circuit 200 outputs the second variable voltage VV2 can be reduced.

Furthermore, in some embodiments, the sizes of the fifth transistor M5C and the sixth transistor M6C can be smaller than sizes of the first transistor MIA and the second transistor M2A.

Also, in some embodiments, the power switch circuit 300 can further include a second leakage control unit having the same structure as the first leakage control unit 340 for reducing the leakage current on the first transistor M1A. In this case, the second leakage control unit can be coupled to the first terminal of the second transistor M2A and the control terminal of the first transistor M1A, and can be controlled by the operation voltage VOP.

Figure 5:
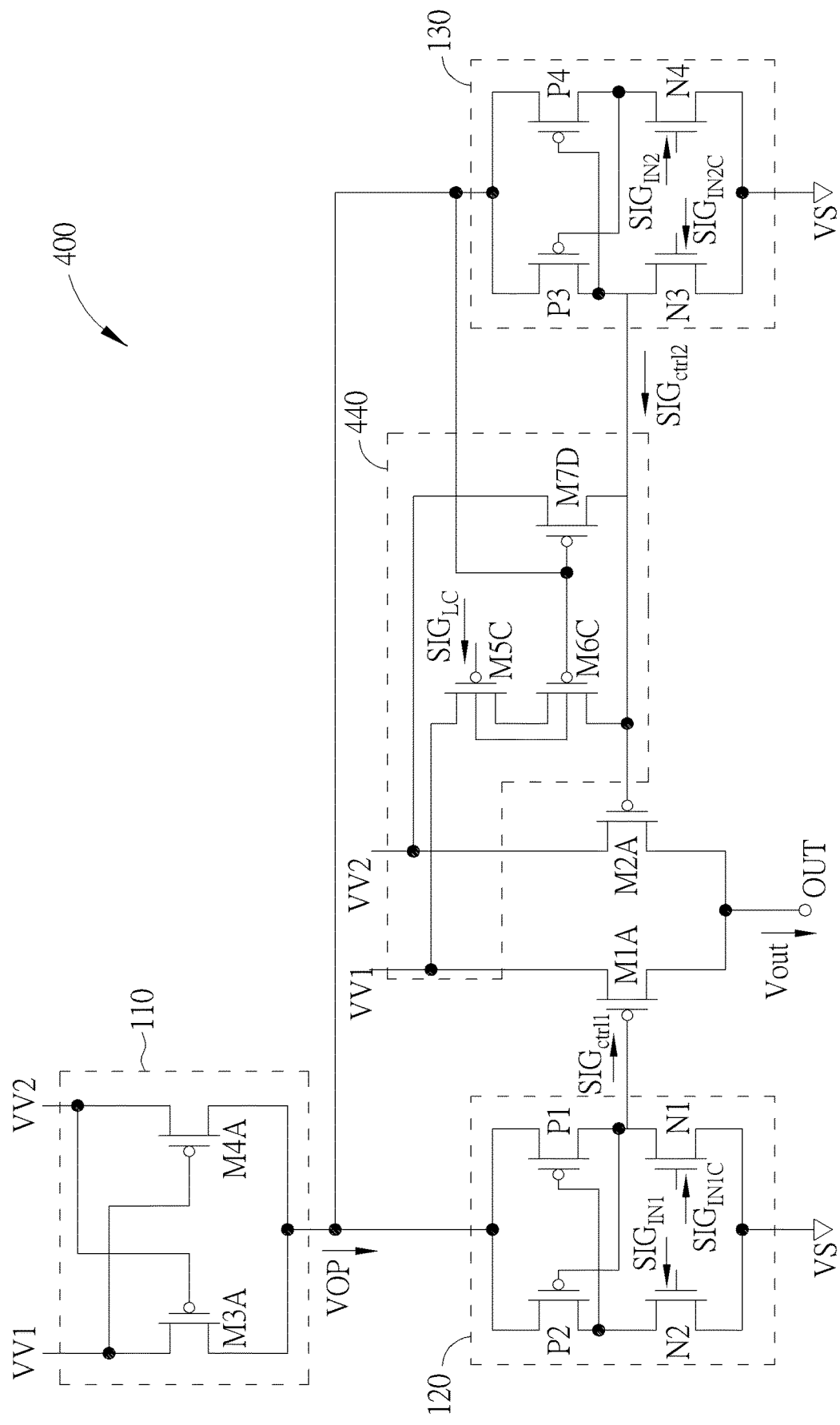
FIG. 5 shows a power switch circuit according to another embodiment of the present invention.

FIG. 5 shows a power switch circuit 400 according to another embodiment of the present invention. The power switch circuit 400 and the power switch circuit 300 have similar structures and can be operated with similar principles. However, the first leakage control unit 440 further includes a seventh transistor M7D.

The seventh transistor M7D has a first terminal coupled to the first terminal of the second transistor M2A, a second terminal coupled to the second terminal of the first leakage control unit 440, and a control terminal coupled to the control terminal of the first leakage control unit 440. That is, the seventh transistor M7D can be used to reduce the leakage current in the power switch circuit 400 as the fifth transistor M5A in the power switch circuit 100. In this case, the seventh transistor M7D can be a P-type transistor, and the size of the seventh transistor M7D can be smaller than the sizes of the first transistor M1A and the second transistor M2A.

Also, in some embodiments, the power switch circuit 400 can further include a second leakage control unit having the same structure as the first leakage control unit 440 for reducing the leakage current on the first transistor M1A. In this case, the second leakage control unit can be coupled to the control terminal of the first transistor M1A and the first terminals of the first transistor M1A and the second transistor M2A. The second leakage control unit can be controlled by the operation voltage VOP.

In summary, the power switch circuits provided by the embodiments of the present invention can reduce the leakage current with the leakage control unit, allowing the charge pump to pump the voltage to the target level smoothly. Also, since the leakage control unit is mainly used to adjust the voltage at the control terminal of the transistors for outputting the output voltage, the leakage control unit will not induce large current, and the size of the leakage control unit can be rather small.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power switch circuit comprising:
an output terminal configured to output an output voltage;
a voltage selection unit configured to receive a first variable voltage and a second variable voltage, and output a greater one of the first variable voltage and the second variable voltage as an operation voltage;
a first level shift circuit coupled to the voltage selection unit, and configured to output a first control signal according to a first input signal;
a second level shift circuit coupled to the voltage selection unit, and configured to output a second control signal according a second input signal;
a first transistor having a first terminal configured to receive the first variable voltage, a second terminal coupled to the output terminal of the power switch circuit, and a control terminal coupled to the first level shift circuit for receiving the first control signal;
a second transistor having a first terminal configured to receive the second variable voltage, a second terminal coupled to the output terminal of the power switch circuit, and a control terminal coupled to the second level shift circuit for receiving the second control signal; and
a first leakage control unit having a first terminal coupled to the first terminal of the first transistor and/or the first terminal of the second transistor, a second terminal coupled to the control terminal of the second transistor, and a control terminal configured to receive the operation voltage, the first leakage control unit being configured to establish an electrical connection between the first terminal and the second terminal of the first leakage control unit according to the operation voltage.

2. The power switch circuit of claim 1, wherein:
the first variable voltage is generated by a charge pump; and
after the charge pump is enabled, the first variable voltage is increased from being smaller than the second variable voltage to being greater than the second variable voltage.

3. The power switch circuit of claim 2, wherein:
the first leakage control unit establishes the electrical connection when the first variable voltage is substantially equal to the second variable voltage.

4. The power switch circuit of claim 1, wherein the first transistor and the second transistor are P-type transistors.

5. The power switch circuit of claim 1, wherein the voltage selection unit comprises:
an output terminal configured to output the operation voltage;
a third transistor having a first terminal configured to receive the first variable voltage, a second terminal coupled to output terminal of the voltage selection unit, and a control terminal configured to receive the second variable voltage; and
a fourth transistor having a first terminal configured to receive the second variable voltage, a second terminal coupled to output terminal of the voltage selection unit, and a control terminal configured to receive the first variable voltage.

6. The power switch circuit of claim 5, wherein the third transistor and the fourth transistor are P-type transistors.

7. The power switch circuit of claim 1, wherein the first leakage control unit comprises:
a fifth transistor having a first terminal coupled to the first terminal of the first leakage control unit, a second terminal coupled to the second terminal of the first leakage control unit, and a control terminal coupled to the control terminal of the first leakage control unit.

8. The power switch circuit of claim 7, wherein the fifth transistor is a P-type transistor.

9. The power switch circuit of claim 7, wherein a size of the fifth transistor is smaller than a size of the first transistor, and the size of the fifth transistor is smaller than a size of the second transistor.

10. The power switch circuit of claim 7, wherein:
the first terminal of the fifth transistor is coupled to the first terminal of the second transistor; and
the first leakage control unit further comprises a sixth transistor having a first terminal coupled to the first terminal of the first transistor, a second terminal coupled to the second terminal of the first leakage control unit, and a control terminal coupled to the control terminal of the first leakage control unit.

11. The power switch circuit of claim 10, wherein the fifth transistor and the sixth transistor are P-type transistors.

12. The power switch circuit of claim 10, wherein sizes of the fifth transistor and the sixth transistor are smaller than sizes of the first transistor and the second transistor.

13. The power switch circuit of claim 1, wherein the first leakage control unit comprises:
a fifth transistor having a first terminal coupled to the first terminal of the first transistor, a second terminal, and a control terminal configured to receive a leakage control signal; and
a sixth transistor having a first terminal coupled to the second terminal of the fifth transistor, a second terminal coupled to the second terminal of the first leakage control unit, and a control terminal coupled to the control terminal of the first leakage control unit.

14. The power switch circuit of claim 13, wherein the fifth transistor and the sixth transistor are P-type transistors.

15. The power switch circuit of claim 13, wherein sizes of the fifth transistor and the sixth transistor are smaller than sizes of the first transistor and the second transistor.

16. The power switch circuit of claim 13, wherein the first leakage control unit further comprises:
a seventh transistor having a first terminal coupled to the first terminal of the second transistor, a second terminal coupled to the second terminal of the first leakage control unit, and a control terminal coupled to the control terminal of the first leakage control unit.

17. The power switch circuit of claim 16, wherein the seventh transistor is a P-type transistor.

18. The power switch circuit of claim 17, wherein a size of the seventh transistor is smaller than a size of the first transistor, and the size of the seventh transistor is smaller than a size of the second transistor.

19. The power switch circuit of claim 1, wherein the first level shift circuit comprises:
a first P-type transistor having a first terminal coupled to the voltage selection unit for receiving the operation voltage, a second terminal configured to output the first control signal, and a control terminal;
a second P-type transistor having a first terminal coupled to the voltage selection unit for receiving the operation voltage, a second terminal coupled to the control terminal of the first P-type transistor, and a control terminal coupled to the second terminal of the first P-type transistor;
a first N-type transistor having a first terminal coupled to the second terminal of the first P-type transistor, a second terminal configured to receive a system voltage, and a control terminal configured to receive a complementary input signal complementary with the first input signal; and
a second N-type transistor having a first terminal coupled to the second terminal of the second P-type transistor, a second terminal configured to receive the system voltage, and a control terminal configured to receive the first input signal.

20. The power switch circuit of claim 1 further comprising a second leakage control unit having a first terminal coupled to the first terminal of the first transistor and/or the first terminal of the second transistor, a second terminal coupled to the control terminal of the first transistor, and a control terminal configured to receive the operation voltage, wherein the second leakage control unit is configured to establish an electrical connection between the first terminal and the second terminal of the second leakage control unit according to the operation voltage.

* * * * *